(12) United States Patent
Hirigoyen et al.

(10) Patent No.: US 8,664,578 B2
(45) Date of Patent: Mar. 4, 2014

(54) IMAGE SENSOR WITH REDUCED CROSSTALK HAVING AN ISOLATION REGION WITH A SECOND TRENCH IN THE ELECTRICALLY CONDUCTIVE MATERIAL OF A FIRST TRENCH

(75) Inventors: Flavien Hirigoyen, Grenoble (FR); Julien Michelot, Grenoble (FR)

(73) Assignee: STMicroelectronics SA, Montrouge (FR)

( * ) Notice: Subject to any disclaimer, the term of this patent is extended or adjusted under 35 U.S.C. 154(b) by 238 days.

(21) Appl. No.: 13/333,884

(22) Filed: Dec. 21, 2011

(65) Prior Publication Data

US 2012/0153127 A1 Jun. 21, 2012

(30) Foreign Application Priority Data

Dec. 21, 2010 (FR) ...................................... 10 05004

(51) Int. Cl.
*H01L 27/00* (2006.01)
(52) U.S. Cl.
USPC ....................................... 250/208.1; 250/239
(58) Field of Classification Search
USPC ........... 250/208.1, 239, 214 R; 257/222–237, 257/243, 244, 440; 438/22–24, 69, 57
See application file for complete search history.

(56) References Cited

U.S. PATENT DOCUMENTS

| 7,187,017 | B2* | 3/2007 | Sawase et al. ................. 257/222 |
| 7,279,770 | B2 | 10/2007 | Mouli | |
| 2005/0184353 | A1 | 8/2005 | Mouli ............................ 257/446 |
| 2006/0043437 | A1 | 3/2006 | Mouli ............................ 257/291 |
| 2007/0020795 | A1 | 1/2007 | Mori et al. ....................... 438/57 |
| 2007/0145516 | A1 | 6/2007 | Lee ................................ 257/499 |
| 2007/0194356 | A1 | 8/2007 | Moon et al. .................... 257/291 |
| 2007/0200148 | A1 | 8/2007 | Hirata et al. ................... 257/222 |
| 2008/0099871 | A1 | 5/2008 | Bui et al. ....................... 257/461 |

FOREIGN PATENT DOCUMENTS

| JP | 2005-123449 A | 5/2005 |
| JP | 2008-10544 A | 1/2008 |
| KR | 10-2010-0025107 A | 3/2010 |

OTHER PUBLICATIONS

U.S. Appl. No. 13/333,885, Roy et al.

* cited by examiner

*Primary Examiner* — Que T Le
(74) *Attorney, Agent, or Firm* — Seed IP Law Group PLLC

(57) ABSTRACT

An image sensor having a semiconductor substrate, at least two photosites in the substrate and an isolation region between the photosites. The isolation region has a first trench covered by a thin electrically insulating liner and filled with an electrically conductive material, the conductive material has a second trench at least partially filled with an optically isolating material.

23 Claims, 4 Drawing Sheets

IMAGE SENSOR WITH REDUCED CROSSTALK HAVING AN ISOLATION REGION WITH A SECOND TRENCH IN THE ELECTRICALLY CONDUCTIVE MATERIAL OF A FIRST TRENCH

BACKGROUND

1. Technical Field

The present disclosure relates to an image sensor including at least two photosites separated by an isolation region and a method for fabricating the same.

2. Description of the Related Art

Camera modules typically include a lens, an infrared filter, and an image sensor in the form of a semiconductor chip including several photosites, one or more photosites corresponding to a pixel of a captured image. The photosites are generally arranged in a matrix and may include for example photodiodes, photogates, or photoconductors. In general, above the photosites are distributed a mosaic of microlenses to converge incident light rays on the photosites and a mosaic of color filters to filter the light.

An image sensor uses the photoelectric effect to transform light information into an electrical signal. A photon of an incident light ray penetrates into the material of the photosite, and if the energy of the photon is equal to or greater than the material's energy bandgap, an electron-hole pair is generated. The number of electrons per photosite may be read as an electronic signal and used to supply light information for the image. Photons with short wavelengths have a shallow penetration depth, such as 0.4 μm for wavelengths of 450 nm (blue light), and photons with long wavelengths have a deeper penetration depth, such as 2.4 μm for wavelengths of 600 nm (red light).

The performance of an image sensor depends on many factors, such as the quantum efficiency (the number of electrons generated and read per number of incident photons), the dark current (the amount of current generated even when the photosites are not receiving incident light rays), and the crosstalk (optical or electrical). Optical crosstalk between photosites occurs when the photons of an incident light ray are absorbed by a photosite other than the one that should absorb them. Electrical crosstalk occurs when an electron generated in one photosite and migrates to another photosite. Isolation regions are therefore commonly provided between photosites to prevent optical and/or electrical crosstalk.

The isolation region may be in the form of a deep trench isolation ("DTI") with a depth as great as possible taking into account the penetration distance of the photons with the longest wavelength, and lined with an electrically insulating liner. In this manner, generated electrons cannot pass under or through the isolation region from one photosite to another, reducing electrical crosstalk. The deep trench may further be filled with an optically isolating material such as oxide to create an "optical waveguide" reducing optical crosstalk by means of total internal reflection of light rays, so that they remain within a photosite.

FIG. 1 is a cross-sectional view of a part of a conventional image sensor IS1 including, from bottom to top as illustrated, a substrate 10 including two photosites S1, S2; an insulator layer 70; a stack 80 of dielectric layers 80-1 to 80-N, each layer including electrically conductive lines 90-1 to 90-N to extract electrical information from and power the photosites; color filters F1, F2; and microlenses L1, L2. Isolation region 11 extends between photosites S1, S2, and includes a deep trench 15 made in the substrate 10. The trench 15 has its bottom and sidewalls covered by a thin insulating liner 20, such as a dielectric material, and is filled with an optical isolator 40, such as an oxide.

FIG. 1 schematically shows three incident light rays R1, R2, R3. Light ray R1 passes through filter F1, penetrates into photosite S1, and generates an electron E1 in photosite S1. Light ray R2 also passes through filter F1 and generates an electron E2 in photosite S1, which remains within photosite S1 due to the deep trench 15. Light ray R3 passes through filter F2, but has an incident angle such that instead of generating an electron directly in photosite S2, it reflects off the optical waveguide formed between the substrate 10 and the isolator 40. Light ray R3 returns to photosite S2, where it generates an electron E3.

Interfacial traps are generally present at the atomic layers closest to the interface between the trench 15 and the substrate 10. These traps are caused by cutting the crystalline lattice of the substrate 10 to form the trench 15. These traps may bond with generated carriers (electrons and holes). The depth of the deep trench 15 causes a larger interface, thus a greater number of traps, increasing the dark current.

BRIEF SUMMARY

An embodiment relates to an image sensor including a semiconductor substrate, at least two photosites in the substrate, and an isolation region between the photosites, including a first trench having a depth of at least 2 microns, covered by a thin electrically insulating liner, and filled with an electrically conductive material, wherein the conductive material includes a second trench at least partially filled with an optically isolating material.

According to one embodiment, the semiconductor substrate has a first refractive index, the conductive material has a second refractive index, the optically isolating material has a third refractive index, and the first index is greater than the second index, and the second index is greater than the third index.

According to one embodiment, the first and second refractive indices are greater than 3, and the third refractive index is less than 2.

According to one embodiment, the image sensor further comprises a contact coupled to the conductive material to apply a voltage to the conductive material.

According to one embodiment, the thickness of the conductive material surrounding the second trench is substantially uniform.

According to one embodiment, the image sensor further includes a filter and a microlens above each photosite.

An embodiment relates to a method for fabricating an image sensor, the method including: forming at least two photosites in a semiconductor substrate having a first refractive index, forming a first trench having a depth of at least two microns between the photosites, forming a thin electrically insulating liner on at least the sidewalls of the first trench, and depositing in the first trench an electrically conductive material having a second refractive index less than the first refractive index, forming a second trench in the conductive material, and filling the second trench with an optically isolating material having a third refractive index less than the second refractive index.

According to one embodiment, the method further includes depositing a dielectric layer, and forming a contact in the dielectric layer, allowing a voltage to be applied to the conductive material.

According to one embodiment, the conductive material is deposited using a conformal deposition process to obtain the second trench without etching the conductive material.

An embodiment relates to a device comprising an image sensor according to one of the embodiments described above, and electrical circuitry coupled to the image sensor.

In an embodiment, an image sensor comprises: a semiconductor substrate having a first refractive index; two photosites in the substrate; and an isolation region separating the photosites, the isolation region including: a first trench having a depth of at least two microns and an electrically insulating liner, and at least partially filled with an electrically conductive material, the electrical conductive material having a second refractive index less than the first refractive index; and a second trench in the electrically conductive material and at least partially filled with an optically isolating material, the optically isolating material having a third refractive index less than the second refractive index. In an embodiment, the image sensor further comprises a contact coupled to the conductive material and configured to apply a first voltage to a first region of the conductive material. In an embodiment, the first and second refractive indices are greater than 3, and the third refractive index is less than 2. In an embodiment, a thickness of the conductive material surrounding the second trench is substantially uniform. In an embodiment, the image sensor further comprises a filter and a microlens above each photosite. In an embodiment, the image sensor further comprises: a first contact coupled to a first region of the conductive material and configured to apply a first voltage to the first region of the conductive material; and a second contact coupled to a second region of the conductive material and configured to apply a second voltage to the second region of the conductive material. In an embodiment, the first and second trenches extend through the semiconductor substrate and the conductive material comprises two regions of conductive material separated by the optically isolating material.

In an embodiment, a method comprises: forming two photosites in a semiconductor substrate, the semiconductor substrate having a first refractive index; forming a first trench having a depth of at least two microns between the two photosites; forming an electrically insulating liner on at least the sidewalls of the first trench; positioning an electrically conductive material in the first trench, the electrically conductive material having a second refractive index less than the first refractive index and a second trench; and positioning an optically isolating material in the second trench, the optical isolating material having a third refractive index less than the second refractive index. In an embodiment, the method further comprises: depositing a dielectric layer, and forming an electrical contact in the dielectric layer, the contact being coupled to the conductive material. In an embodiment, the positioning the conductive material comprises depositing the conductive material using a conformal deposition process to obtain the second trench without etching the conductive material. In an embodiment, the method further comprises: depositing a dielectric layer; forming a first electrical contact in the dielectric layer, the first contact being coupled to a first region of the conductive material; and forming a second electrical contact in the dielectric layer, the second contact being coupled to a second region of the conductive material. In an embodiment, the first and second trenches extend through the semiconductor substrate and the conductive material comprises two regions of conductive material separated by the optically isolating material.

In an embodiment, a device comprises: a processor; and an image sensor communicatively coupled to the processor, the image sensor including: a semiconductor substrate having a first refractive index; two photosites in the substrate; and an isolation region separating the photosites, the isolation region including: a first trench having a depth of at least two microns and an electrically insulating liner, and at least partially filled with an electrically conductive material, the electrical conductive material having a second refractive index less than the first refractive index; and a second trench in the electrically conductive material and at least partially filled with an optically isolating material, the optically isolating material having a third refractive index less than the second refractive index. In an embodiment, the first and second trenches extend through the semiconductor substrate and the conductive material comprises two regions of conductive material separated by the optically isolating material. In an embodiment, the image sensor further comprises a contact coupled to the conductive material and configured to apply a voltage to the conductive material. In an embodiment, the image sensor further comprises a filter and a microlens above each photosite. In an embodiment, the image sensor comprises additional photosites in the substrate and additional isolation regions separating photosites in the substrate. In an embodiment, the device further comprises: a first contact coupled to a first region of the conductive material and configured to apply a first voltage to the first region of the conductive material; and a second contact coupled to a second region of the conductive material and configured to apply a second voltage to the second region of the conductive material.

In an embodiment, a system comprises: a semiconductor substrate having a first refractive index; a plurality of means for sensing photons positioned in the semiconductor substrate; and means for isolating the plurality of means for sensing photons extending at least two microns into the semiconductor substrate and including; means for electrically isolating the plurality of means for sensing photons; means for conducting positioned on the means for electrically isolating the plurality of means for sensing photons, the means for conducting having a second refractive index less than the first refractive index; and means for optically isolating the plurality of means for sensing photons positioned in the means for conducting and having a third refractive index less than the second refractive index. In an embodiment, the system further comprises means for processing information generated by the plurality of means for sensing photons.

In an embodiment, an image sensor comprises: a semiconductor substrate; two photosites in the substrate; and an isolation region separating the photosites, the isolation region including: a first trench having an electrically insulating liner and at least partially filled with an electrically conductive material; and a second trench in the electrically conductive material and at least partially filled with an optically isolating material. In an embodiment, the image sensor further comprises a contact coupled to the conductive material and configured to apply a voltage to the conductive material. In an embodiment, the semiconductor substrate has a first refractive index, the conductive material has a second refractive index, the optically isolating material has a third refractive index, and the first index is greater than the second index, and the second index is greater than the third index. In an embodiment, the first and second refractive indices are greater than 3, and the third refractive index is less than 2. In an embodiment, the first trench has a depth of at least 2 microns. In an embodiment, a thickness of the conductive material surrounding the second trench is substantially uniform. In an embodiment, the image sensor comprises a filter and a microlens above each photosite. In an embodiment, the first trench extends through the semiconductor substrate. In an embodiment, the second trench extends through the semiconductor substrate and the conductive material comprises two regions of conductive material separated by the optically isolating material. In an embodiment, the image sensor further comprises a contact coupled to the conductive material and configured to apply a first voltage to a first region of the conductive material. In an embodiment, the image sensor further comprises: a first contact coupled to a first region of the conductive material and configured to apply a first voltage to the first region of the conductive material; and a second contact coupled to a second region of the conductive material and configured to apply a second voltage to the second region of the conductive material.

In an embodiment, a method comprises: forming two photosites in a semiconductor substrate; forming a first trench between the two photosites; forming an electrically insulating liner on at least the sidewalls of the first trench; positioning an electrically conductive material in the first trench, the electrically conductive material having a second trench; and positioning an optically isolating material in the second trench. In an embodiment, the method further comprises: depositing a dielectric layer, and forming an electrical contact in the dielectric layer, the contact being coupled to the conductive material. In an embodiment, the positioning the conductive material comprises depositing the conductive material using a conformal deposition process to obtain the second trench without etching the conductive material. In an embodiment, the method further comprises: depositing a dielectric layer; forming a first electrical contact in the dielectric layer, the first contact being coupled to a first region of the conductive material; and forming a second electrical contact in the dielectric layer, the second contact being coupled to a second region of the conductive material.

In an embodiment, a device comprises: a processor; and an image sensor communicatively coupled to the processor, the image sensor including: a semiconductor substrate; two photosites in the substrate; and an isolation region separating the photosites, the isolation region having: a first trench with an electrically insulating liner and at least partially filled with an electrically conductive material; and a second trench in the electrically conductive material and at least partially filled with an optically isolating material. In an embodiment, the image sensor further comprises a contact coupled to the conductive material and configured to apply a voltage to the conductive material. In an embodiment, the semiconductor substrate has a first refractive index, the conductive material has a second refractive index, the optically isolating material has a third refractive index, and the first index is greater than the second index, and the second index is greater than the third index. In an embodiment, the image sensor further comprises a filter and a microlens above each photosite. In an embodiment, the first trench extends through the semiconductor substrate. In an embodiment, the second trench extends through the semiconductor substrate and the conductive material comprises two regions of conductive material separated by the optically isolating material. In an embodiment, the image sensor comprises additional photosites in the substrate and additional isolation regions separating photosites in the substrate. In an embodiment, the device further comprises: a first contact coupled to a first region of the conductive material and configured to apply a first voltage to the first region of the conductive material; and a second contact coupled to a second region of the conductive material and configured to apply a second voltage to the second region of the conductive material.

In an embodiment, an image sensor comprises: first means for sensing photons; second means for sensing photons; means for electrically and optically isolating the first and second means for sensing photons; and means for passivating interfacial traps. In an embodiment, the means for passivating comprises a contact coupled to a conductive material of the means for isolating. In an embodiment, the image sensor further comprises a filter and a microlens above each means for sensing photons. In an embodiment, the image sensor comprises a semiconductor substrate and the means for isolating comprises: a first trench in the semiconductor substrate with an electrically insulating liner and at least partially filled with an electrically conductive material; and a second trench in the electrically conductive material and at least partially filled with an optically isolating material.

In an embodiment, a system comprises: a semiconductor substrate; a plurality of means for sensing photons positioned in the semiconductor substrate; and means for isolating the plurality of means for sensing photons extending through the semiconductor substrate and including; means for electrically isolating the plurality of means for sensing photons; means for conducting positioned on the means for electrically isolating the plurality of means for sensing photons; and means for optically isolating the plurality of means for sensing photons positioned in the means for conducting. In an embodiment, the system further comprises means for processing information generated by the plurality of means for sensing photons.

BRIEF DESCRIPTION OF THE SEVERAL VIEWS OF THE DRAWINGS

Example embodiments will now be described in connection with, but not limited to, the appended drawings in which.

DETAILED DESCRIPTION

Figure 1:
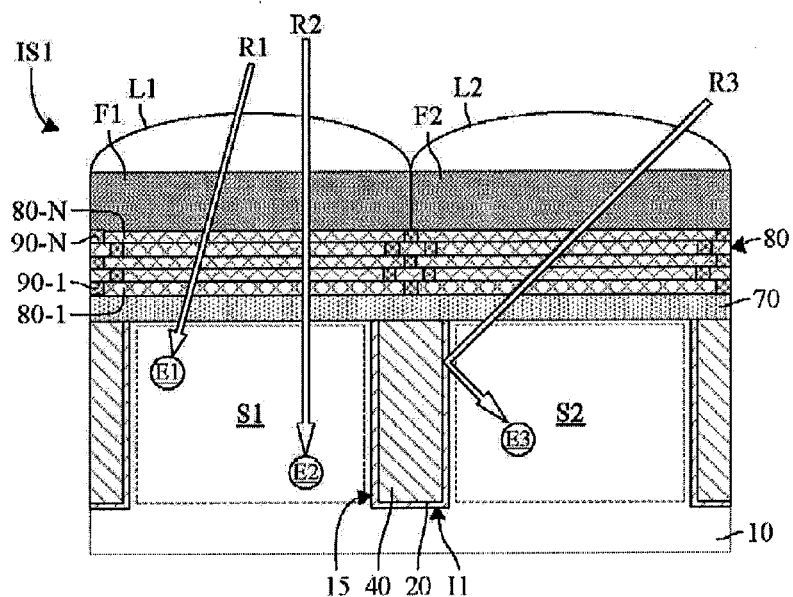
FIG. 1, previously described, is a cross-sectional view of a part of a conventional image sensor.

In the following description, certain details are set forth in order to provide a thorough understanding of various embodiments of devices, methods and articles. However, one of skill in the art will understand that other embodiments may be practiced without these details. In other instances, well-known structures and methods associated with, for example, image sensors, semiconductor fabrication processes, etc., have not been shown or described in detail in some figures to avoid unnecessarily obscuring descriptions of the embodiments.

Unless the context requires otherwise, throughout the specification and claims which follow, the word "comprise" and variations thereof, such as "comprising," and "comprises," are to be construed in an open, inclusive sense, that is, as "including, but not limited to."

Reference throughout this specification to "one embodiment," or "an embodiment" means that a particular feature, structure or characteristic described in connection with the embodiment is included in at least one embodiment. Thus, the appearances of the phrases "in one embodiment," or "in an embodiment" in various places throughout this specification are not necessarily referring to the same embodiment, or to all embodiments. Furthermore, the particular features, structures, or characteristics may be combined in any suitable manner in one or more embodiments to obtain further embodiments.

The headings are provided for convenience only, and do not interpret the scope or meaning of this disclosure or the claims.

The sizes and relative positions of elements in the drawings are not necessarily drawn to scale. For example, the shapes of various elements and angles may not be drawn to scale, and some of these elements may be enlarged and positioned to improve drawing legibility. Further, the particular shapes of the elements as drawn are not necessarily intended to convey any information regarding the actual shape of particular elements, and have been selected solely for ease of recognition in the drawings. Geometric references are not intended to refer to ideal embodiments. For example, a reference to square-shaped does not mean that an element has a geometrically perfect square shape.

FIGS. 2A to 2G are cross-sectional views schematically showing different steps of fabricating an image sensor IS2.

Figure 2A:
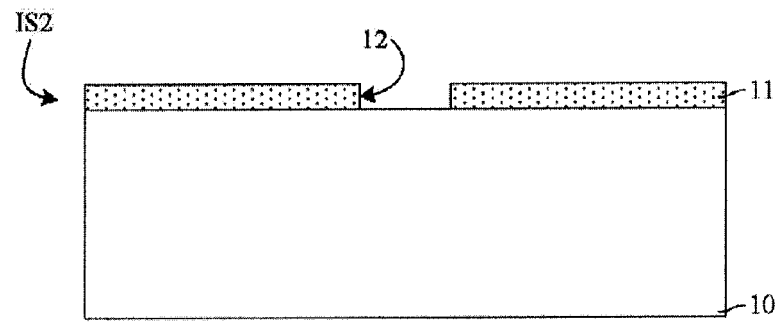
FIGS. 2A to 2G show steps of a process of fabricating an image sensor according to an embodiment.

In FIG. 2A, the image sensor IS2 comprises a substrate 10 covered by a mask layer 11. The mask layer may be a "hard mask" covered by a resist layer (not shown). The substrate 10 comprises photosites S1, S2 fabricated during precedent processing steps. The substrate has a first refractive index, such as approximately 4 for silicon. An opening 12 has been made in the mask layer 11, between the photosites S1, S2. The patterning of the opening 12 has been done for example by means of conventional photolithography steps of exposure, development, and etching.

Figure 2B:
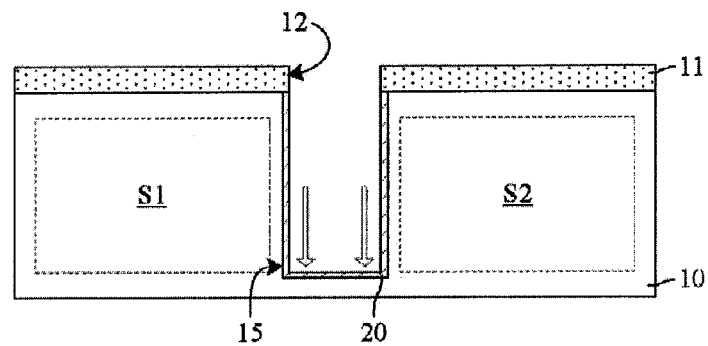

During steps shown in FIG. 2B, a trench 15 is etched in the substrate 10 through the opening 12. The trench 15 may be a relatively deep trench, for example with a depth of at least 2 μm. A reactive ion etch ("RIE") process may be used with an anisotropic etch reagent to obtain a trench with substantially vertical sidewalls. For the sake of simplicity, only a single trench is shown in FIGS. 2A to 2F, though other trenches may be made in some embodiments, such as trenches on the other sides of photosites S1, S2.

A thin electrically insulating liner 20 is then formed on the sidewalls and bottom of trench 15. The liner 20 prevents electrons from diffusing out of the photosites. The liner 20 may be formed using a conformal process, so that its thickness is substantially uniform. The liner 20 may be a dielectric material, silicon dioxide SiO2, nitric oxide NO, silicon oxide SiO, a high density plasma (HDP) oxide, a spin on dielectric (SOD), or other suitable material, and may be thermally grown or deposited. The liner 20 may have a thickness of approximately 10 nm.

Figure 2C:
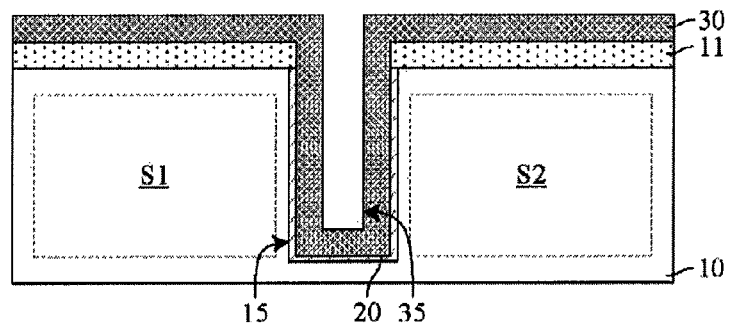

During steps shown in FIG. 2C, a conformal deposition process is used to deposit an electrically conductive material 30 in the trench 15 and on the top of the image sensor. The conductive material 30 may be polysilicon, doped (N or P) conductive material containing silicon, undoped polysilicon, silicon-germanium, or an undoped polysilicon that is deposited and then doped. The conductive material 30 has a second refractive index, which may be, for example, 3.5 for polysilicon.

The conductive material 30 may be deposited by means of chemical vapor deposition ("CVD"), and may have a thickness of approximately 40 nm on each sidewall and the bottom of the trench 15. The deposition process may be such that the conductive material 30 only partially fills the trench 15, so that a second trench 35 is formed in the conductive material 30. Alternatively, the trench 15 may be completely filled with the conductive material 30, and then the second trench 35 may be formed by, for example, etching the conductive material 30.

Figure 2D:
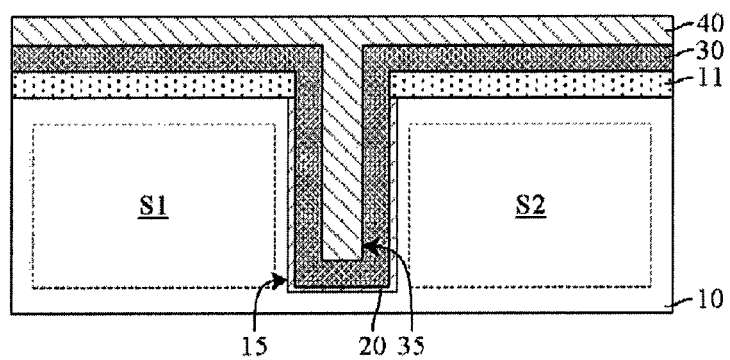

During steps shown in FIG. 2D, an optically isolating material 40 is deposited in the trench 35 and on the top of the image sensor. The optical isolator 40 may be silicon dioxide SiO2, nitric oxide NO, silicon oxide SiO, a high density plasma (HDP) oxide, a spin on dielectric (SOD), or other suitable material, and may be thermally grown or deposited. The optical isolator 40 has a third index of refraction, which may be, for example, 1.5 for silicon dioxide. The optical isolator 40 may have a thickness of approximately 40 nm in the second trench 35.

Figure 2E:
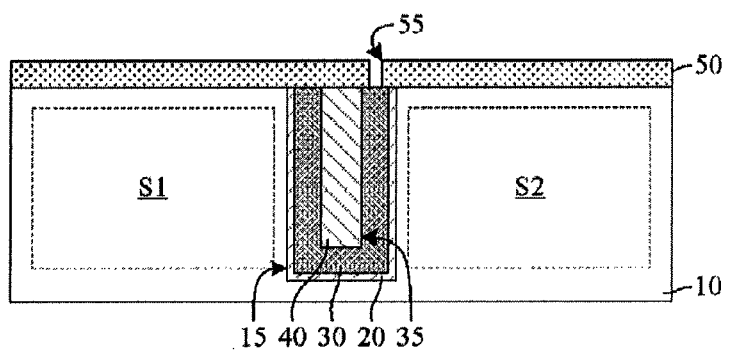

During steps shown in FIG. 2E, the optical isolator 40, the conductive material 30, and the mask layer 11 are removed to the top of the substrate 10. This may be done in one or more steps, such as a first step of chemical-mechanical polishing ("CMP") of the optical isolator 40 and the conductive material 30, followed by an etching of the mask layer 11. Alternatively, the optical isolator 40 and the conductive material 30 may slightly extend above the top surface of the substrate 10. The trench 15 thus comprises the liner 20, the conductive material 30, and the second trench 35 within the conductive material 30 filled with the optical isolator 40.

A pre-metal dielectric ("PMD") layer 50 is then deposited on the top surface of the image sensor IS2, and a hole 55 is formed in the layer 50, above the conductive material 30. The hole 55 may be formed by etching after a photolithographic patterning step.

Figure 2F:
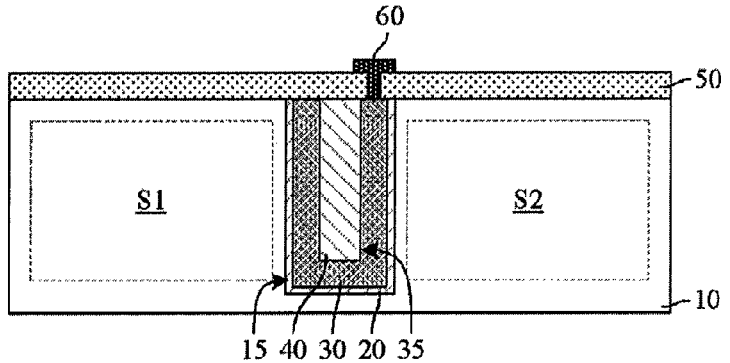

During steps shown in FIG. 2F, an electrical contact 60 is formed in the hole 55. The contact 60 is in contact with the conductive material 30 in the trench 15. In an embodiment, the contact 60 is configured to apply a bias voltage to the conductive material 30. During the use of the sensor, the contact 60 may be employed to bias the conductive material 30 positive or negative, depending upon the type of photosite, and the amount of biasing may be adjusted to create an accumulation region around the sidewalls of the trench 15. In this manner, interfacial traps at the interface between the substrate 10 and the trench 15 may be passivated, and thus dark current may be reduced.

Figure 2G:
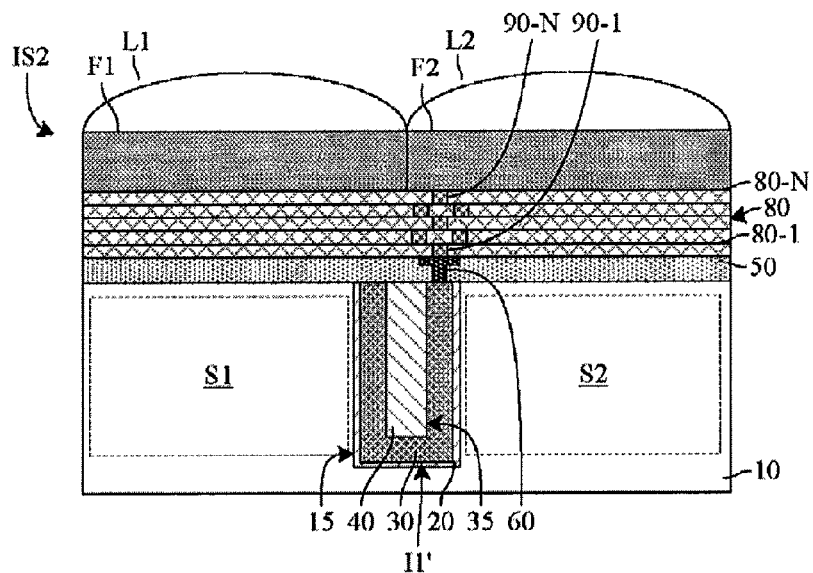

During steps shown in FIG. 2G, the image sensor IS2 undergoes further processing steps. A stack 80 of dielectric layers 80-1 to 80-N is formed on the image sensor surface, each dielectric layer comprising one or more conductive lines 90-1 to 90-N. Color filters F1, F2 are formed over the photosites, and then microlenses L1, L2 are formed above the color filters. Isolation region I1' extends between sites S1, S2 and comprises the first deep trench 15 having its bottom and sidewalls covered by the thin liner 20 and filled with the conductive material 30. The isolation region I1' further comprises the second trench 35 in the conductive material 30, filled with the optically isolating material 40.

Isolation region I1' reduces optical crosstalk thanks to an optical waveguide formed by the differences in refractive indices between the substrate 10, the conductive material 30, and the optical isolator 40. The liner 20 is generally too thin to influence the optical properties of the isolation regions. Total internal reflection occurs when a ray of light strikes an interface between two materials at an angle smaller than a critical angle, the angle of incidence below which the total internal reflection occurs. Depending on the thickness of and the refractive index of the material on the other side of the interface, no light passes through and it is entirely reflected.

As described above, the substrate 10 has a first refractive index such as 4, the conductive material 30 has a second refractive index such as 3.5, and the optical isolator 40 has a third refractive index such as 1.5. These indices may be chosen so that the first index is greater than the second, and the second index is greater than the third.

According to an embodiment, the contacts 60 are provided to bias the conductive material 30 during use of the image sensor. One of the conductive lines, for example line 90-1, is in electrical contact with contact 60 to apply an electrical voltage to the conductive material 30 of the isolation region I1' in order to passivate the interfacial traps near the sidewalls of the trench 15. By applying a voltage to the conductive material, it is possible to create an accumulation region along the sidewalls and bottom of the trench 15. The conductive material may be biased positive or negative, and the amount of biasing may vary depending on the materials used and the structure of the photosite. The biasing of the sidewalls using contact 60 produces an electrical field, such that any electrons generated near the interface between the substrate 10 and the trench 15 may be returned to the photosite due to the electric field, instead of being trapped by the interfacial traps at this interface.

Figure 3:
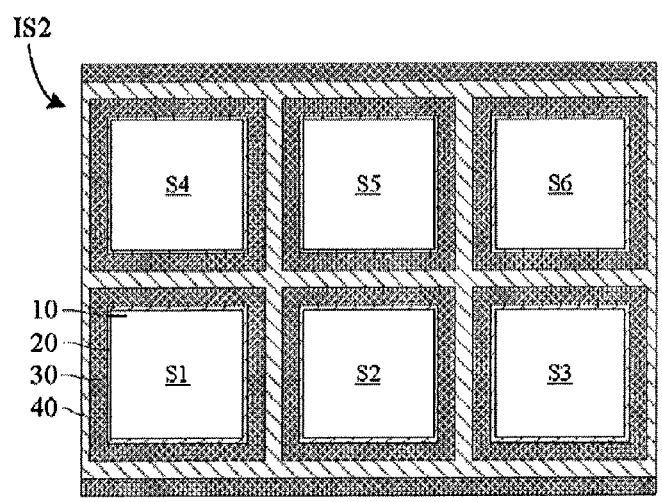
FIG. 3 is a top view of an embodiment of an image sensor.

FIG. 3 is a top view of the image sensor IS2 according to one embodiment. Image sensor IS2 is shown as comprising six photosites, S1 to S6, but may extend in the plane of the image sensor. In FIG. 3, it may be seen that each photosite is completely surrounded by the isolation regions. In particular, any two photosites are separated by the liner 20, the conductive material 30, the optical isolator 40, the conductive material 30, and the liner 20.

In other embodiments, the liner 20 is not deposited or formed on the bottoms of the trench 15. It may be deposited on the bottom and then removed, such as during a thinning process, or may be deposited only on the sidewalls, such as by using a deposition mask on the bottom of the trench that is removed after the deposition of the liner 20. Similarly, the conductive material 30 may be two separate portions entirely separated by the optical isolator 40. In this case, two contacts 60 per isolation region may be provided on either side of the optical isolator 40, each contact 60 being in contact with one of the conductive material parts.

Figure 4:
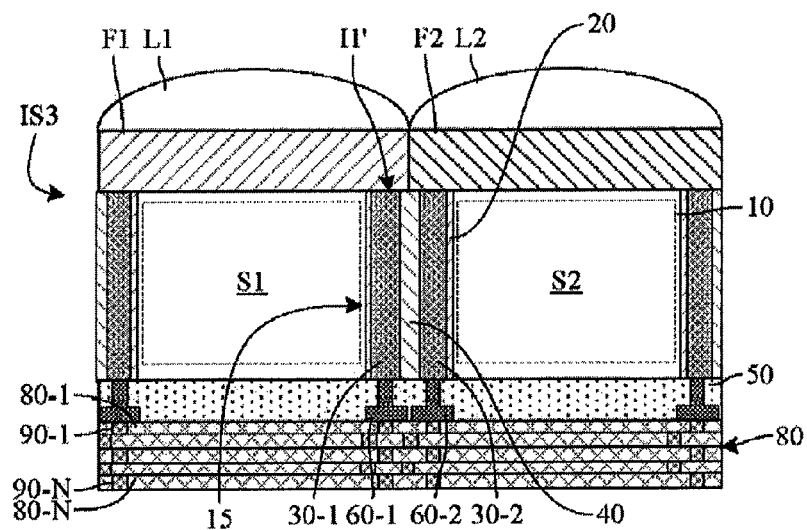
FIG. 4 shows an image sensor fabricated according to a embodiment.

FIG. 4 shows a cross-sectional view of a second embodiment of an image sensor IS3. Image sensor IS3 differs from image sensor IS2 in that the color filters F1, F2, F3 and the microlenses L1, L2, L3 are arranged on the backside of the substrate 10, which is then turned around to face the incident light. The trench 15 extends entirely through the substrate 10 and the liner 20 extends on both sidewalls of the trench. The optical isolator 40 extends entirely through the trench 15, and the conductive material 30 in the trench is separated into two regions 30-1 and 30-2. A contact 60-1 is formed over conductive material 30-1, and a contact 60-2 is formed over conductive material 30-2. Thus, the image sensor may be configured to bias the two regions 30-1 and 30-2 to different respective voltages.

In this manner, the stack 80 of dielectric layers 80-1 to 80-N and the metal interconnections 90-1 to 90-N do not block or deflect light from reaching the photosites, which can significantly increase sensitivity of the image sensor, in particular for smaller and smaller photosite sizes.

To fabricate such image sensors, the substrate 10 may be "thinned" after certain processing steps to, for example, approximately 2-20 μm, depending upon the application. If the substrate is too thick, the photons will be absorbed in the substrate too far away from the photosites, increasing electrical crosstalk. On the contrary, if the substrate is too thin, longer wavelengths will pass right through the substrate and not be absorbed, decreasing quantum efficiency. The isolation regions may therefore extend entirely through the substrate, depending on the depth of the trenches and the amount of substrate thinning performed. After thinning, the color filters and microlenses may be deposited on the backside of the substrate. An anti-reflective coating may be deposited between the substrate and color filters to reduce reflections.

Figure 5:
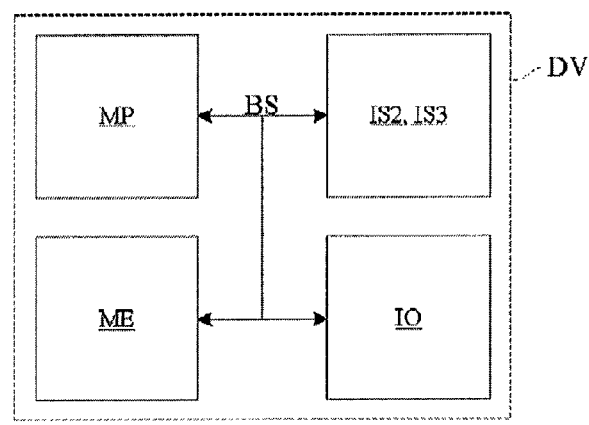
FIG. 5 shows a device including an image sensor according to an embodiment.

Embodiments also relate to a device DV comprising an image sensor, as shown in FIG. 5. The device DV comprises an image sensor IS2, IS3, a microprocessor MP, a memory ME, and an input/output IO. These elements are interconnected by a bus BS. Such a device may be a camera, machine vision, mobile telephone camera, surveillance system, image stabilization system, motion detector, high-end image sensors used in DSLR (Digital Single-Lens Reflex), video cameras, infrared applications, space applications, etc. The materials used and the dimensions (for example, the depth of the trench may be approximately 8 μm for infrared applications) of the image sensor may be adapted accordingly.

In some embodiments, if a doped conductive material 30, such as a doped polysilicon, is deposited or formed in the trench, an annealing step may then be performed to "out-diffuse" the dopants into the substrate area near the sidewalls in order to passivate the interfacial traps.

It will further be understood that the isolation regions may be formed surrounding only certain photosites, such as every other photosite, or only sites of a certain color filter, as desired.

The term "substrate" should be understood as including silicon, silicon-on-insulator (SOI), silicon-on-sapphire (SOS) technology, doped and undoped semiconductors, epitaxial layers of silicon supported by a base semiconductor foundation, silicon-germanium, germanium, gallium-arsenide, or other semiconductor structures. Additionally, the term "photosite" refers to a picture element unit cell having an active area and containing a photo-conversion device and other devices, e.g., transistors, for converting electromagnetic radiation to an electrical signal. For simplicity, exemplary embodiments described herein are explained with reference to a CMOS image sensor. However, it should be noted that the disclosure is not limited to CMOS image sensors and may be used in any suitable device, for example, a charge coupled device (CCD) image sensor, etc.

While the methods described herein provide certain example steps of, for example, making an image sensor, embodiments of devices are not limited to devices made using the particular example steps described herein.

Some embodiments may take the form of or comprise computer program products. For example, according to one embodiment there is provided a computer readable medium comprising a computer program adapted to perform one or more of the methods or functions described above. The medium may be a non-transitory medium such as a physical storage medium, for example, a Read Only Memory (ROM) chip, or a disk such as a Digital Versatile Disk (DVD-ROM), Compact Disk (CD-ROM), a hard disk, a memory, a network, or a portable media article to be read by an appropriate drive or via an appropriate connection, including as encoded in one or more barcodes or other related codes stored on one or more such computer-readable mediums and being readable by an appropriate reader device.

Furthermore, in some embodiments, some or all of the systems and/or modules may be implemented or provided in other manners, such as at least partially in firmware and/or hardware, including, but not limited to, one or more application-specific integrated circuits (ASICs), digital signal processors, discrete circuitry, logic gates, state machines, standard integrated circuits, controllers (e.g., programmed by executing appropriate instructions, and including microcontrollers and/or embedded controllers), field-programmable gate arrays (FPGAs), complex programmable logic devices (CPLDs), etc., as well as devices that employ RFID technology, and various combinations thereof.

The various embodiments described above can be combined to provide further embodiments. Aspects of the embodiments can be modified, if necessary to employ concepts of the various patents, application and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An image sensor, comprising:
a semiconductor substrate having a first refractive index;
two photosites in the substrate; and
an isolation region separating the photosites, the isolation region including:
a first trench having a depth of at least two microns and an electrically insulating liner, and at least partially filled with an electrically conductive material, the electrical conductive material having a second refractive index less than the first refractive index; and
a second trench in the electrically conductive material and at least partially filled with an optically isolating material, the optically isolating material having a third refractive index less than the second refractive index.

2. The image sensor according to claim 1, further comprising a contact coupled to the conductive material and configured to apply a first voltage to a first region of the conductive material.

3. The image sensor according to claim 1 wherein the first and second refractive indices are greater than 3, and the third refractive index is less than 2.

4. The image sensor according to claim 1 wherein a thickness of the conductive material surrounding the second trench is substantially uniform.

5. The image sensor according to claim 1, further comprising a filter and a microlens above each photosite.

6. The image sensor of claim 1, further comprising:
a first contact coupled to a first region of the conductive material and configured to apply a first voltage to the first region of the conductive material; and
a second contact coupled to a second region of the conductive material and configured to apply a second voltage to the second region of the conductive material.

7. The image sensor of claim 1 wherein the first and second trenches extend through the semiconductor substrate and the conductive material comprises two regions of conductive material separated by the optically isolating material.

8. A method, comprising:
forming two photosites in a semiconductor substrate, the semiconductor substrate having a first refractive index;
forming a first trench having a depth of at least two microns between the two photosites;
forming an electrically insulating liner on at least the sidewalls of the first trench;
positioning an electrically conductive material in the first trench, the electrically conductive material having a second refractive index less than the first refractive index and a second trench; and
positioning an optically isolating material in the second trench, the optical isolating material having a third refractive index less than the second refractive index.

9. The method according to claim 8, further comprising:
depositing a dielectric layer, and
forming an electrical contact in the dielectric layer, the contact being coupled to the conductive material.

10. The method according to claim 8 wherein the positioning the conductive material comprises depositing the conductive material using a conformal deposition process to obtain the second trench without etching the conductive material.

11. The method according to claim 8, further comprising:
depositing a dielectric layer;
forming a first electrical contact in the dielectric layer, the first contact being coupled to a first region of the conductive material; and
forming a second electrical contact in the dielectric layer, the second contact being coupled to a second region of the conductive material.

12. The method of claim 8 wherein the first and second trenches extend through the semiconductor substrate and the conductive material comprises two regions of conductive material separated by the optically isolating material.

13. A device, comprising:
a processor; and
an image sensor communicatively coupled to the processor, the image sensor including:
a semiconductor substrate having a first refractive index;
two photosites in the substrate; and
an isolation region separating the photosites, the isolation region including:
a first trench having a depth of at least two microns and an electrically insulating liner, and at least partially filled with an electrically conductive material, the electrical conductive material having a second refractive index less than the first refractive index; and
a second trench in the electrically conductive material and at least partially filled with an optically isolating material, the optically isolating material having a third refractive index less than the second refractive index.

14. The device of claim 13 wherein the first and second trenches extend through the semiconductor substrate and the conductive material comprises two regions of conductive material separated by the optically isolating material.

15. The device of claim 13 wherein the image sensor further comprises a contact coupled to the conductive material and configured to apply a voltage to the conductive material.

16. The device of claim 13 wherein the image sensor further comprises a filter and a microlens above each photosite.

17. The device of claim 13 wherein the image sensor comprises additional photosites in the substrate and additional isolation regions separating photosites in the substrate.

18. The device of claim 13, further comprising:
a first contact coupled to a first region of the conductive material and configured to apply a first voltage to the first region of the conductive material; and
a second contact coupled to a second region of the conductive material and configured to apply a second voltage to the second region of the conductive material.

19. A system, comprising:
a semiconductor substrate having a first refractive index;
a plurality of means for sensing photons positioned in the semiconductor substrate; and means for isolating the plurality of means for sensing photons extending at least two microns into the semiconductor substrate and including;

means for electrically isolating the plurality of means for sensing photons;

means for conducting positioned on the means for electrically isolating the plurality of means for sensing photons, the means for conducting having a second refractive index less than the first refractive index; and means for optically isolating the plurality of means for sensing photons positioned in the means for conducting and having a third refractive index less than the second refractive index.

20. The system of claim 19, further comprising means for processing information generated by the plurality of means for sensing photons.

21. An image sensor, comprising:
a semiconductor substrate;
two photosites in the substrate; and
an isolation region separating the photosites, the isolation region including:

a first trench having an electrically insulating liner and at least partially filled with an electrically conductive material; and a second trench in the electrically conductive material and at least partially filled with an optically isolating material, wherein the first and second trenches extend through the semiconductor substrate and the conductive material comprises two regions of conductive material separated by the optically isolating material.

22. The image sensor according to claim 21, further comprising a contact coupled to the conductive material and configured to apply a first voltage to a first region of the conductive material.

23. The image sensor according to claim 21 wherein:
the semiconductor substrate has a first refractive index,
the conductive material has a second refractive index,
the optically isolating material has a third refractive index, and
the first index is greater than the second index, and the second index is greater than the third index.

* * * * *